United States Patent [19]

Matsuoka et al.

[11] Patent Number: 4,931,020

[45] Date of Patent: Jun. 5, 1990

[54] IC PACKAGE POSITIONING DEVICE IN IC SOCKET FOR IC CARRIER

[75] Inventors: Noriyuki Matsuoka; Masaaki Kubo, both of Tokyo, Japan

[73] Assignee: Yamaichi Electric Mfg. Co., Ltd., Tokyo, Japan

[21] Appl. No.: 321,198

[22] Filed: Mar. 8, 1989

[30] Foreign Application Priority Data

Mar. 8, 1988 [JP]  Japan .................................. 63-54566

[51] Int. Cl.⁵ ............................................ H01R 23/72
[52] U.S. Cl. ...................................... 439/72; 439/330; 439/526
[58] Field of Search ............................. 439/68–73, 439/525, 526, 329, 330, 331

[56] References Cited

U.S. PATENT DOCUMENTS

| | | | |
|---|---|---|---|
| 3,865,458 | 2/1975 | Pauza et al. | 439/595 |
| 4,407,555 | 10/1983 | Lockard | 439/296 |
| 4,675,599 | 6/1987 | Jensen | 439/71 |

FOREIGN PATENT DOCUMENTS

| | | | |
|---|---|---|---|
| 57-158571 | 9/1982 | Japan | 439/70 |
| 58-30295 | 2/1983 | Japan | 439/73 |

*Primary Examiner*—Neil Abrams
*Attorney, Agent, or Firm*—Wenderoth, Lind & Ponack

[57] ABSTRACT

An IC socket apparatus for receiving and positioning an IC package which has a plurality of IC leads projecting laterally therefrom and carried in an IC carrier. An IC socket has an IC package receiving recess therein and a plurality of peripherally shiftable contacts around the periphery of the recess for engaging and contacting leads of an IC package inserted into the recess. Guide elements guide an IC carrier onto the IC socket with an IC package guided into the recess. A guide member in the recess has a plurality of IC package guide portions extending upright from the front surface and spaced for engaging peripheral edge portions of an IC package and has a plurality of contact engaging grooves around the periphery at positions corresponding to positions of leads on an IC package relative to the guide portions and the contacts are engaged in the grooves. The guide member is movably positioned in the recess for movement laterally and rotationally in the recess.

5 Claims, 8 Drawing Sheets

IC PACKAGE POSITIONING DEVICE IN IC SOCKET FOR IC CARRIER

BACKGROUND OF THE INVENTION AND RELATED ART STATEMENT

The present invention relates to a device for positioning an IC package accommodated in and retained by an IC carrier relative to an IC socket for receiving the IC carrier and, more particularly, for aligning IC leads of the IC package with contacts of the IC socket.

As illustrated in FIG. 8(A), generally, an IC socket 1 has a plurality of positioning pins 2 formed upright on the front surface thereof, a plurality of contacts 6 implanted therein, and a pair of lock levers 7 pivotally attached to the opposite sides thereof. On the other hand, an IC package 5 generally has a plurality of IC leads 5a extending sideways therefrom and an IC carrier 3 generally has a plurality of slots 3a formed in the front surface thereof, lock members 8, and a plurality of positioning grooves 4 formed in the side edges thereof, as illustrated in FIG. 8(B). The IC package 5 is positoned relative to the IC carrier 3 with the IC leads 5a thereof accommodated within the slots 3a of the IC carrier 3 and is detachably retained by the IC carrier 3 with the edges thereof locked with the lock members 8 of the IC carrier 3. The IC carrier 3 having the IC package 5 retained therein as illustrated in FIG. 8(B) is turned upside down as illustrated in FIG. 8(A) and is placed on the front surface of the IC socket 1 so that the IC carrier 3 and IC socket 2 are positioned relative to each other by inserting the positioning pins 2 into the positioning grooves 4. At this time, the contacts 6 of the IC socket 1 are led into the slots 3a of the IC carrier 3 and brought into contact with the IC leads 5a of the IC package 5. In this state, the lock levers 7 are operated to engage with the edges of the IC carrier 3. Thus, the IC carrier 3 and IC socket 1 are joined together, and the IC leads 5a of the IC package 5 and contacts 6 of the IC socket 1 are kept in contact with each other.

However, since the IC leads 5a of the IC package have inclination and positonal deviation as illustrated in FIG. 7 and since the contacts 6 of the IC socket 1 also have inclination and positional deviation, it is necessary to increase the width of the slots 3a of the IC carrier 3. This permits shifting of the IC leads 5a and contacts 6 to cause misalignment between the IC leads 5a and the contacts 6. Therefore, even when the IC carrier 3 and IC socket 1 are positively positioned by the positioning pins 2 and positioning grooves 4, there is a possibility of the IC package 5 failing to be positioned at a suitable position relative to the IC socket 1, i.e. a possibility of misalignment between the IC leads 5a and the contacts 6, to thereby decrease the reliability of electrical connection. The possibility of misalignment will be increased by displacement of an IC lead 5a and a contact 6 within the same slot 3a in the opposite directions and errors in formation of the positioning pins 2 and positioning grooves 4. In order to eliminate these drawbacks, it is necessary to design the slots 3a so that the width thereof is made substantially equal to that of the IC leads 5a and to design the positioning pins 2 and positioning grooves 4 so that the positioning pins 2 are snugly fitted in the positioning grooves 4. However, such design of the slots 3a will deform the IC leads 5a and such snug fitting design will make more difficult the attachment and detachment between the IC carrier 3 and the IC socket 1.

OBJECT AND SUMMARY OF THE INVENTION

The main object of the present invention is to provide an IC package positioning device in an IC socket for receiving an IC carrier having an IC package retained therein, capable of aligning IC leads of the IC package with contacts of the IC socket which has a simple construction but which does not impose strict restrictions either on slots of the IC carrier for receiving the IC leads or on positioning pins and positioning grooves formed on the IC socket and in the IC carrier respectively.

To attain the object described above, according to the present invention, there is provided a device for positioning an IC package which has a plurality of IC leads and is accommodated and retained within an IC package accommodation section of an IC carrier relative to an IC socket which has a plurality of contacts and receives the IC carrier thereon, the device comprising a guide member having IC package guide portions and contact guide portions and movably provided on the IC socket, the guide member being moved when the IC package is placed on the IC socket to align the IC package guide portions with the peripheral wall of the IC package and elastically displace the contacts so that the contacts align with the IC leads.

The above and other objects, characteristic features and advantages of the present invention will become more apparent to those skilled in the art as the disclosure is made in the following description of preferred embodiments of the invention, as illustrated in the accompanying drawings.

DETAILED DESCRIPTION OF THE PREFERRED EMBODIMENTS

The present invention will now be described with reference to the illustrated embodiments in conjunction with an IC package 15, an IC carrier 11 and an IC socket 12.

Figure 1:
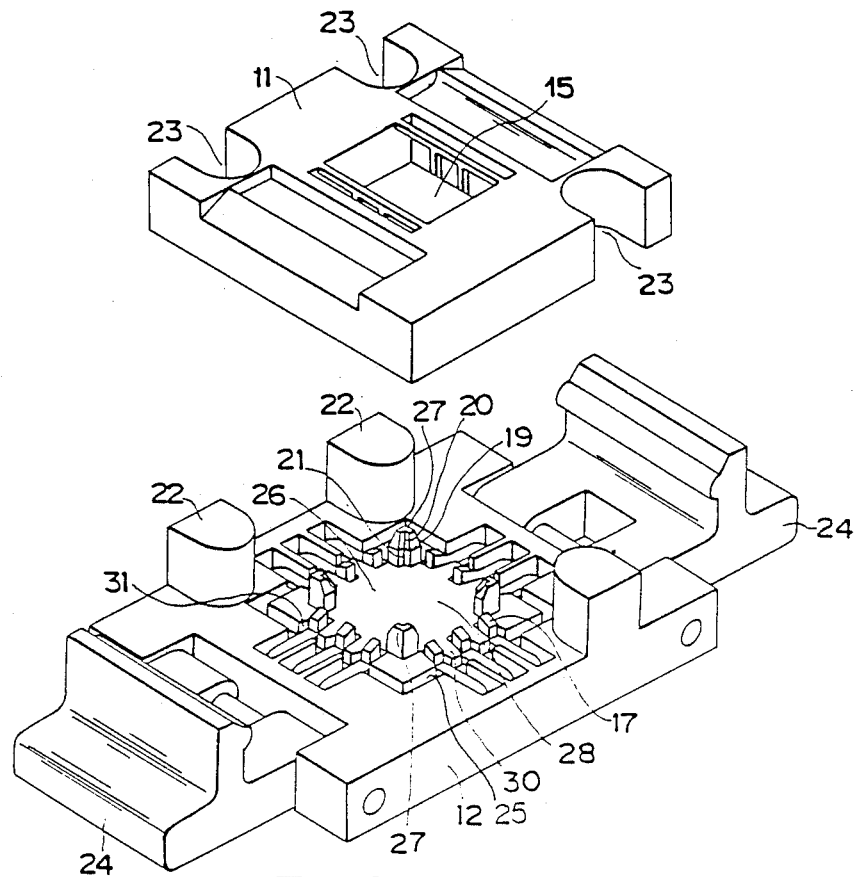
FIG. 1(A) is a perspective view illustrating an IC carrier with an IC package retained therein and an IC socket with one embodiment of the IC package positioning device according to the present invention provided thereon, which IC carrier and IC socket are in a separated state.
FIG. 1(B) is a plan view illustrating the IC carrier with the IC package retained therein.
FIG. 1(C) is a plan view illustrating another IC carrier.
FIG. 1(D) is a plan view illustrating the IC package.
Figure 1:
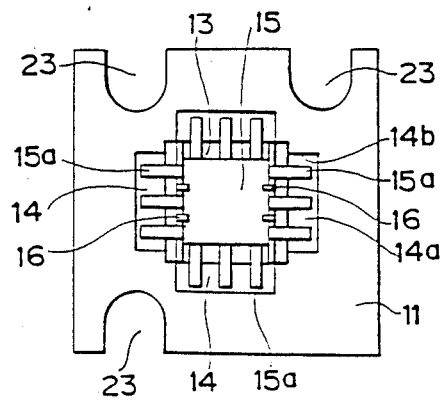
Figure 1C:
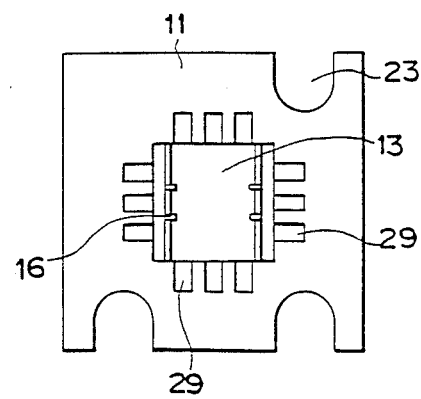
Figure 1D:
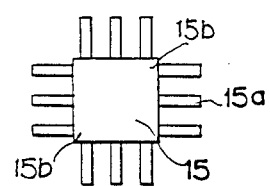

As illustrated in FIG. 1(D), the IC package 15 comprises a substantially square body having four corners 15b and a plurality of IC leads 15a extending sideways from the four sides of the body. The IC package 15 may optionally have a construction (not shown) such that a plurality of IC leads 15a extend from a pair of opposite sides of the body.

As illustrated in FIG. 1(B), the IC carrier 11 has an IC package accommodation section 13 formed in the central portion thereof and four seats 14 formed around the section 13. Each of the seats 14 has a flat surface 14a having substantially the same length as one side of the IC package 15 for accommodating therein and supporting thereon a row of IC leads 15 extending from one side of the IC package 15 and each seat also has a pair of opposite ends 14b for regulating the side edges of the two IC leads 15a at the opposite extremities of the row. The IC carrier 11 also has lock members 16 formed on or around the accommodation section 13 so as to be engageable with the opposite edges of the body of the IC package 15. The IC carrier 11 may optionally have a construction (not shown) such that it has a pair of opposite seats 14 so that an IC package having IC leads extending from a pair of opposite sides thereof can be accommodated and retained therein.

The IC package 15 is retained in the IC carrier 11 by accommodating the IC package 15 in the accommodation section 13 while supporting the IC leads 15a on the flat surface 14a of the seats 14, and engaging the lock members 16 with the edges of the IC package 15 so that the IC package 15 is slightly shiftable in the forward, backward, rightward and leftward directions with the IC leads 15a supported on the flat surfaces 14a of the seats 14. The IC package 15 may optionally be immovably locked by the lock members 16. The IC package 15 may optionally be retained in an IC carrier 11 having a plurality of slots 29 as illustrated in FIG. 1(C) with the respective IC leads 15a slightly movably accommodated in the slots 29.

Figure 2A:
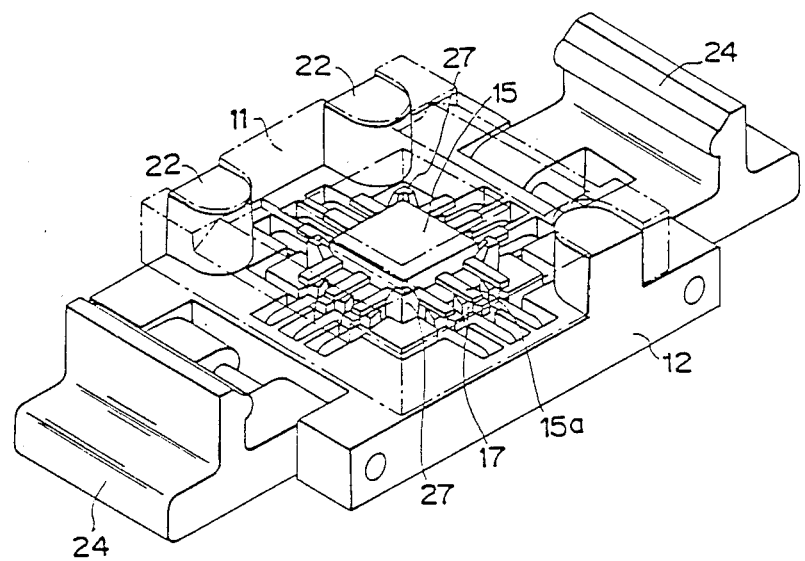
FIG. 2(A) is a perspective view illustrating the IC package positioned by the IC package positioning device provided on the IC socket, with the IC carrier shown by phantom lines.

As illustrated in FIG. 1(A), the IC socket 12 has a plurality of contacts 17 implanted therein and arranged so as to correspond to the IC leads 15a of the IC package 15, a pair of lock levers 24 pivotally attached to the opposite sides thereof for locking the IC carrier 11, and a section 25 formed to correspond to the accommodation section 13 of the IC carrier 11 for accommodating therein an IC package positioning device of the present invention. The IC carrier 11 having the IC package 15 retained therein is turned upside down as illustrated in FIG. 1(A) and, in this state, the IC carrier 11 is placed on the IC socket 12 as shown in FIG. 2(A) to obtain a state of contact between the IC leads 15a of the IC package 15 and the contacts 17 of the IC socket 12.

Figure 3:
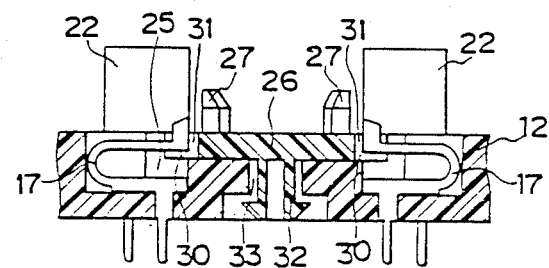
FIG. 3 is a cross section illustrating the IC package positioning device provided on the IC socket.

One embodiment of the IC package positioning device according to the present invention comprises a guide member 26, a plurality of contact guide portions 30 formed on the peripheral edge of the guide member 26 and defining contact engaging grooves 31 between respective adjacent guide portions, four IC package guide portions 27 formed upright on the corner portions of the guide member 26 so as to regulate the four corners 15b of the IC package 15 and define a space 28 for accommodating the IC package 15 therein, and an engaging leg 32 extending vertically from the bottom center of the guide member 26, as illustrated in FIG. 3. The guide member 26 is loosely inserted into the section 25 of the Ic socket 12. At this time, the engaging leg 32 is also loosely inserted into a guide hole 33 formed in the central portion of the section 25 of the IC socket 12 so that a pawl of the engaging leg 32 is engageable with a stepped portion of the IC socket 12 formed immediately below the guide hole 33 and, on the other hand, the contact guide portions 30 guide the contacts 17 of the IC socket 12 into the contact engaging grooves 31 so that portions (free ends) of the contacts 17 brought into contact with the IC leads 15a of the IC package 15 project upwardly from the top of the guide member 26. When the IC package positioning device is set in place relative to the IC socket 12, as described above, it is movable omnidirectionally in one plane within the section 25 as shown in FIG. 5(B) due to the loose fitting between the guide member 26 and the section 25 and the loose fitting between the engaging leg 32 and the guide hole 33. Each of the IC package guide portions 27 has an axial guide groove 19 open toward the center of the space 28 and consisting of an upper inclined or arcuate groove 20 expanding outwardly toward the free end of the IC package guide portion 27 and a lower vertical groove 21 continuing from the upper groove 20 and conforming to the center 15b of the IC package 15, as illustrated in FIG. 1(A). The upper inclined grooves 20 of the axial guide grooves 19 of the IC package guide portions 27 facilitate insertion of the IC package 15 into the space 28 and the lower vertical grooves 21 position the IC package 15 utilizing the corners 15b of the IC package 15.

Figure 2B:
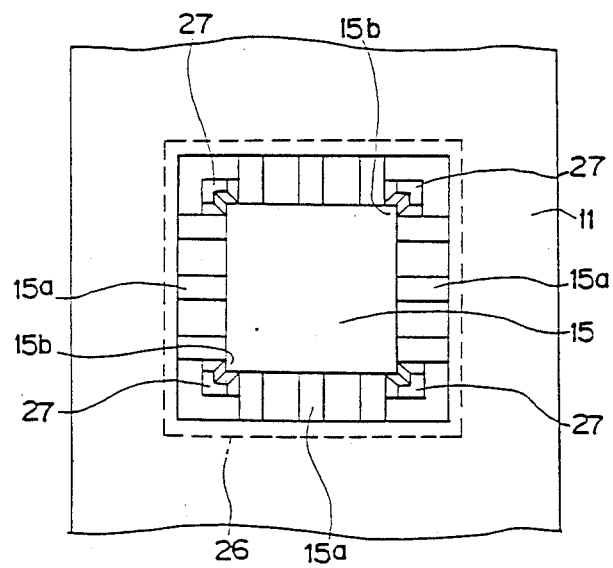
FIG. 2(B) is a schematic plan view illustrating the IC package positioned by the IC package positioning device.

When the IC carrier 11 having the IC package 15 retained therein is placed on the IC socket 12, the IC package guide portions 27 are inserted in the accommodation section 13 and regulate the positions of the corners 15b of the IC package 15 by the upper inclined grooves 20 to accommodate the IC package 15 in the space 28 defined by the IC package guide portions 27. At this time, the IC package 15 is spaced apart from the top of the guide member 26, whereas the IC leads 15a are superposed on the contacts 17. The relative positon of the IC package 15 and the guide member 26 is obtained by the movement of the guide member 26 within the section 25 of the IC socket 12 and/or the movement of the IC package 15 within the accommodation section 13 of the IC carrier 11 through the guiding action of the IC package guide portions 27. The state of the IC package 15 and the guide member 26 being relatively positioned is shown in FIGS. 2(A) and 2(B). With the movement of the guide member 26, the contacts 17 of the IC socket 12 guided into the contact engaging grooves 31 by the contact guide portions 30 are elastically displaced at their free ends. By placing the IC carrier 11 with the IC package 15 on the IC socket 12 to bring the corners 15b of the IC package 15 into engagement against the IC package guide portions 27, as described above, the guide member 26 and/or the IC package 15 move relative to each other to position the IC package 15 within the space 28 with the corners 15b accommodated within the guide grooves 19 and, at the same time, the contacts 17 of the IC socket 12 are elastically displaced by the contact guide portions 30 with the movement of the guide member 26. As a result, the IC leads 15a of the IC package are aligned with the contacts 17 of the IC socket 12.

Figure 4A:
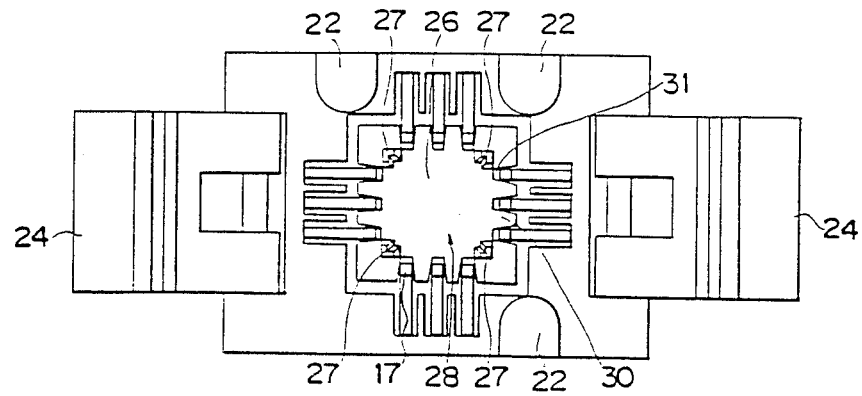
FIG. 4(A) is a plan view illustrating the IC package positioning device provided on the IC socket.
Figure 4B:
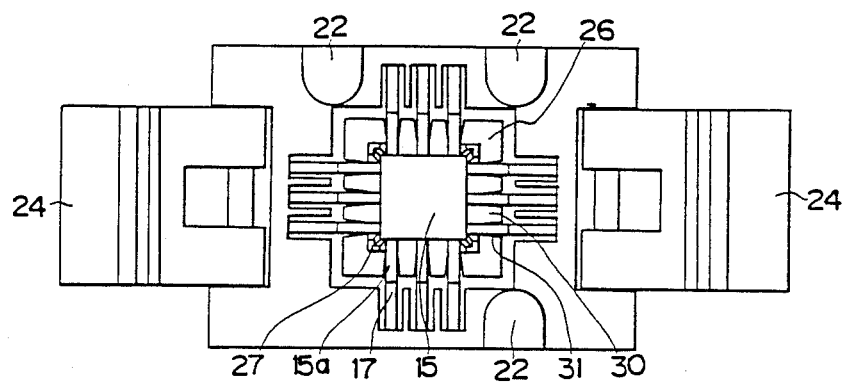
FIG. 4(B) is a plan view illustrating the positional relation between the IC package and the IC package positioning device, with the IC carrier omitted, when the IC package is retained at a suitable position in the IC carrier.
Figure 4C:
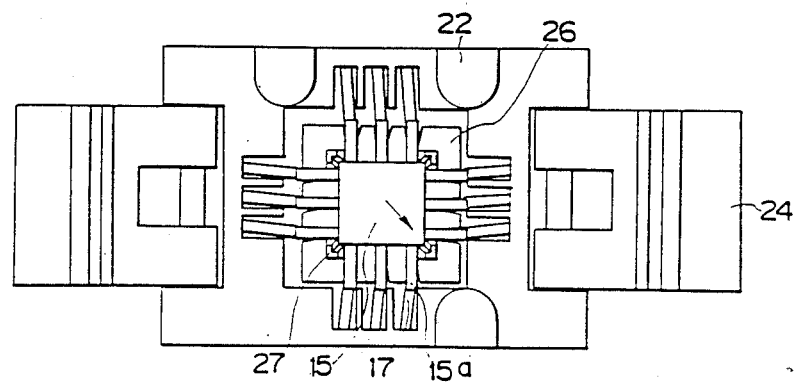
FIG. 4(C) is a plan view similar to FIG. 4(B), but illustrating the condition in which the IC package positioning device has been moved rightward and backward owing to the IC package having been retained at a deviated position in the IC carrier.
Figure 4D:
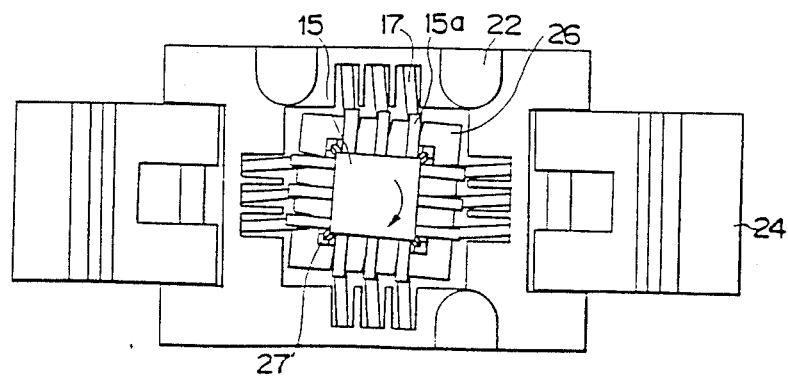
FIG. 4(D) is a plan view similar to FIG. 4(B), but illustrating the condition in which the IC package positioning device has been moved in a rotation direction owing to the IC package having been retained at another deviated position in the IC carrier.

FIG. 4(A) shows the positional relation between the guide member 26 of the IC package positioning device and the contacts 17 of the IC socket 12 before the IC carrier 11 is placed on the IC socket 12. FIG. 4(B) shows the positional relation among the guide member 26, contacts 17 and IC leads 15a when the IC package 15 is retained at a suitable position in the IC carrier 11 which is omitted from illustration. In FIG. 4(B), therefore, the Ic leads 15a and the contacts 17 are aligned with each other without either moving the guide member 26 or elastically displacing the contacts 17. FIG. 4(C) shows the same relation as that of FIG. 4(B), but the guide member 26 is moved in the rightward and backward directions by the IC package 15 because of the deviation of the IC package 15 relative to the IC carrier 11 and the contacts 17 are displaced with the movement of the guide member 26. FIG. 4(D) shows the same relation as that of FIG. 4(B), but the guide member 26 is moved in the rotating direction by the IC package 15 because of the deviation of the IC package 15 relative to the IC carrier 11 and the contacts 17 are displaced elastically with the movement of the guide member 26. In spite of the deviation of the IC package 15, in FIGS. 4(C) and 4(D), alignment between the IC leads 15a and the contacts 17 can be obtained by the movement of the guide member 26 and elastic displacement of the contacts 17.

Figure 5A:
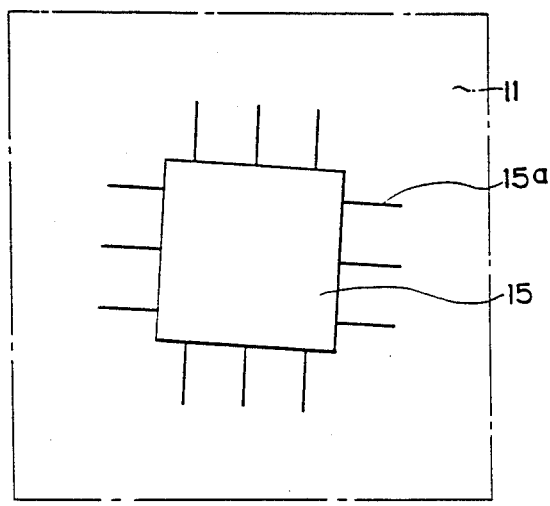
FIG. 5(A) is a schematic plan view illustrating the IC package which has been retained at a deviated position in the IC carrier.
Figure 5B:
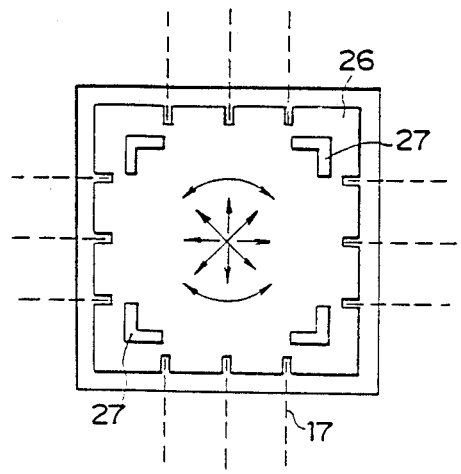
FIG. 5(B) is a schematic explanatory view illustrating the direction in which the IC package positioning device is movable.
Figure 5C:
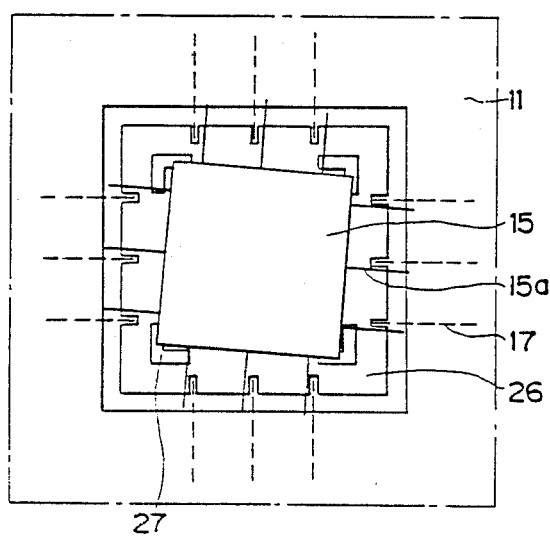
FIG. 5(C) is a schematic plan view illustrating the IC package of FIG. 5(A) which has been placed on the IC package positioning device of FIG. 5(B).
Figure 5D:
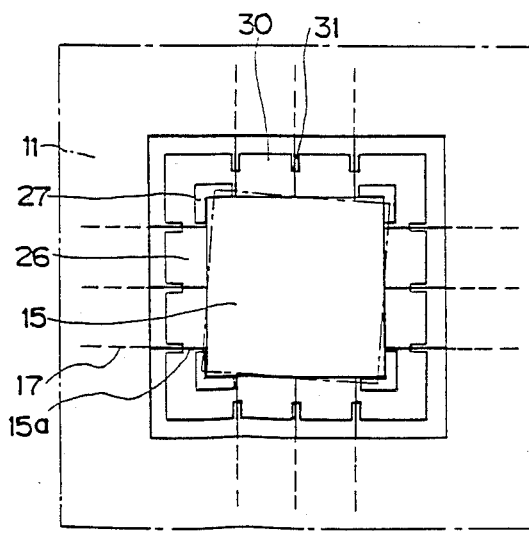
FIG. 5(D) is a schematic plan view illustrating the IC package of FIG. 5(A) which has been moved by the IC package positioning device of FIG. 5(B).
Figure 5E:
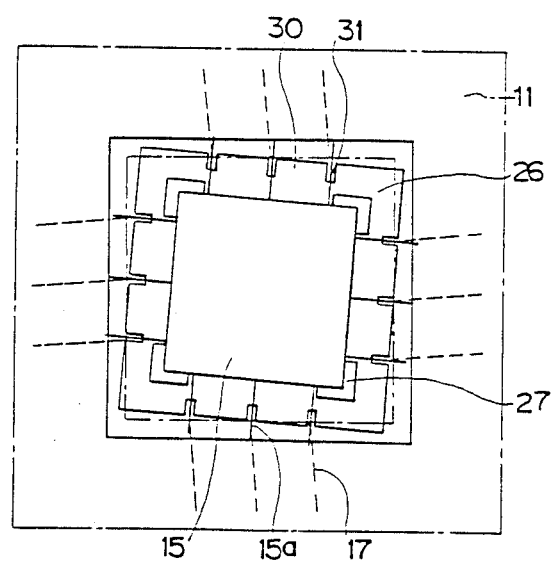
FIG. 5(E) is a schematic plan view illustrating the IC package positioning device of FIG. 5(B) which has been moved by the IC package of FIG. 5(A).

FIG. 5(A) schematically shows that the Ic package 15 is retained in the IC carrier in a deviated state. FIG. 5(B) schematically shows the IC package positioning device and illustrates the directions in which the guide member 26 of the IC package positioning device is movable. FIG. 5(C) schematically shows a state wherein the IC package 15 of FIG. 5(A) is placed on the IC package positioning device of FIG. 5(B). FIG. 5(D) schematically shows a state wherein the deviated IC package 15 of FIG. 5(A) is moved to be positioned relative to the guide member 26. FIG. 5(E) schematically shows a state wherein the guide member 26 is moved to be positioned relative to the IC package 15.

In the embodiment illustrated in FIG. 1(A) to FIG. 5(E), the IC package positioning device has four IC package guide portions 27 for guiding the four corners 15b of the IC package. However, this is by no means limitative. For example, two IC package guide portions can be provided upright on the guide member in a diagonally opposed fashion, thereby regulating a pair of diagonal corners of the IC package.

In addition, the guide member 26 of this embodiment is laterally movable omnidirectionally in one plane within the section 25 of the IC socket 12. This is by no means limitative. The guide member may also be movable vertically.

Furthermore, in the same embodiment, when the IC carrier 11 is placed on the IC socket 12, the IC package 15 is spaced from the top of the guide member 26. However, this is by no means limitative. The IC package may be brought into contact with the top of the guide member and, by lowering the IC package and guide member together, the IC leads of the IC package may be brought into pressure contact with the IC package may be brought into pressure contact with the contacts of the IC socket. In this case, the guide member is retained on the IC socket by a spring member (not shown) so that it can be elastically moved vertically.

Figure 6:
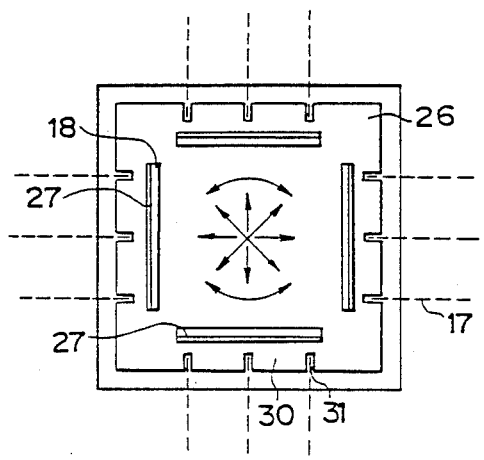
FIG. 6 is a schematic plan view illustrating another embodiment of the IC package positioning device according to the present invention.
Figure 7:
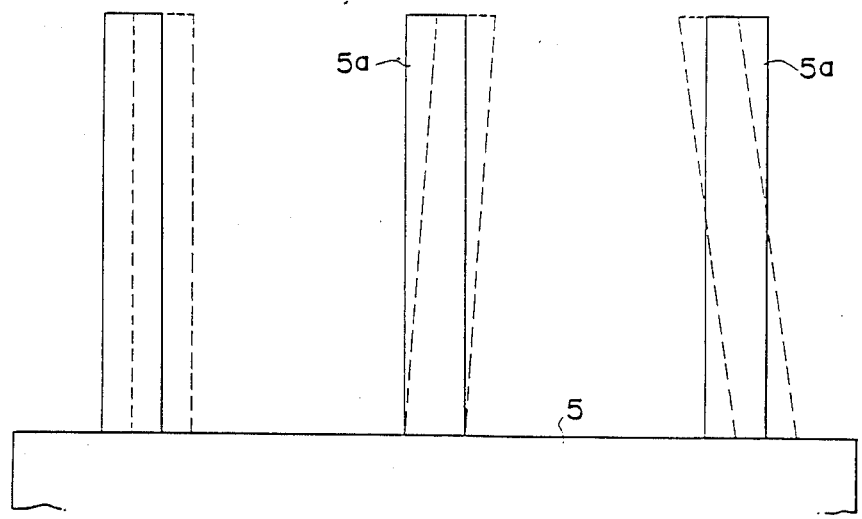
FIG. 7 is a schematic enlarged plan view illustrating deviated IC leads of an IC package.
Figure 8A:
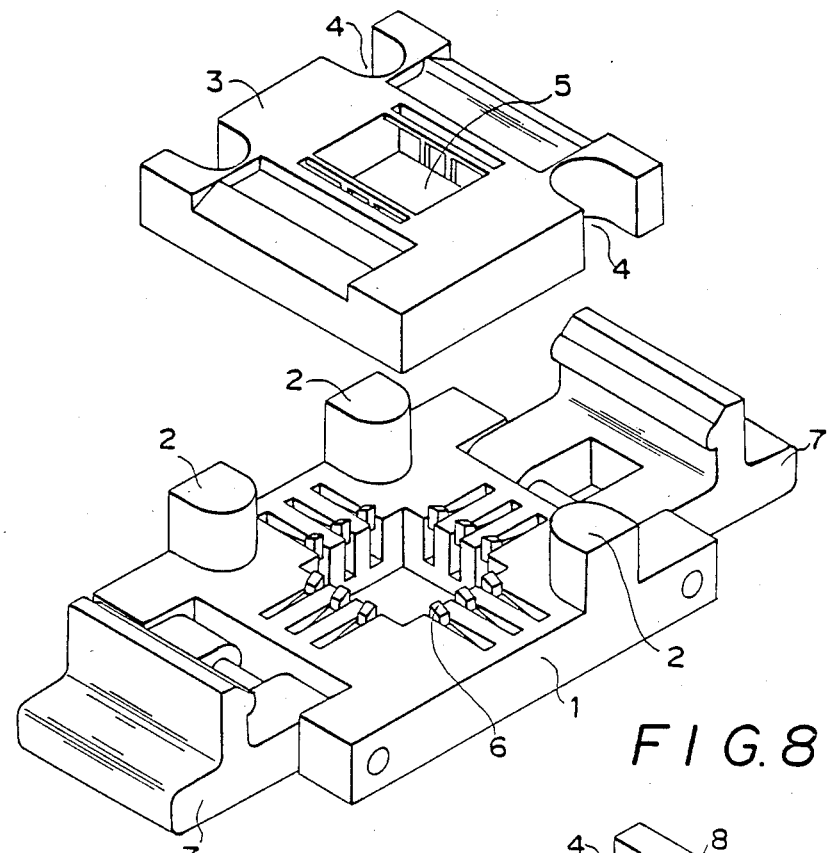
FIG. 8(A) is a perspective view illustrating a prior art IC carrier with an IC package retained therein and a prior art IC socket, which are in a separated state.
Figure 8B:
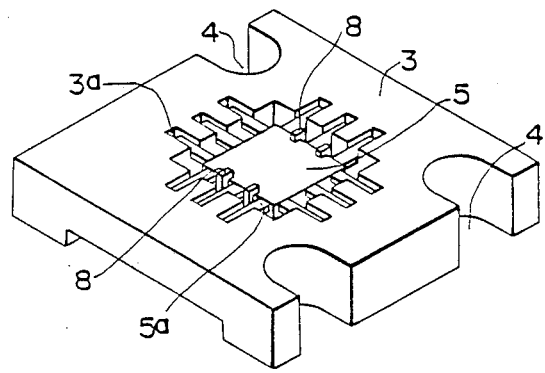
FIG. 8(B) is a plan view illustrating the prior art IC carrier with the IC package retained therein.

FIG. 6 is a schematic plan view illustrating a second embodiment of the IC package positioning device according to the present invention. In the second embodiment, the IC package guide portions 27 each having an inclined or arcuate surface 18 expanding outwardly toward the free end thereof and are formed at positions corresponding to the four side portions of the IC package so that they can regulate the positions of the four sides of the IC package 15. Any of the aforementioned modifications of the first embodiment may be made in the second embodiment. For example, a pair of IC package guide portions 27 may be formed on the guide member 26 in a face-to-face relation so that the positions of a pair of opposite sides of the IC package 15 are regulated.

In the case where positioning grooves 23 are formed in the peripheral edge of the IC carrier 11 and positioning pins 22 are formed upright on the front surface of the IC socket 12 so as to correspond in position to the positioning grooves 23, similarly to the prior art IC carrier and prior art IC socket, when the IC carrier 11 having the IC package 15 retained therein is turned upside down and placed on the IC socket, the positioning pins 22 are inserted into the positioning grooves 23 to position the Ic carrier 11 and IC socket 12 relative to each other while the IC package guide portions 27 are inserted into the accommodation section 13 along the wall of the IC carrier 11 defining the accommodation section 13 to regulate the positions of the peripheral edges of the IC package 15 and move the guide member 26 and/or IC package 15 so that the IC package 15 is positioned at a suitable position and, at the same time, the contacts 17 of the IC socket 12 are displaced elastically and guided into the seats 14 or slots 29 of the IC carrier 11 to be aligned with the IC leads 15a of the IC package 15. The lock levers 24 are then engaged with the peripheral edge of the IC carrier 11, thereby joining the IC carrier 11 and IC socket 12 together and maintaining the state of contact between the IC package 11 and the IC socket 12.

The Ic package guide portions 27 may be constructed such that when they are inserted into the accommodation section 13, their inner surfaces guide the IC package 15 to position the IC package 15 and their outer surfaces contact the wall of the IC carrier 11 defining the accommodation section 13 to position the IC carrier 11. With this construction, since the IC carrier 11 and IC package 15 are positioned by the IC package guide portions 27, the positioning grooves 23 can be omitted, thereby enabling the miniaturization of an IC carrier.

Generally, since an IC carrier is used for the purpose of protecting and carrying an IC package, it has to be constructed such that it can retain the IC package therein so that the IC package and IC leads thereof are not projected from the surface of the IC package. When the IC carrier is placed on an IC socket, it is positioned relative to the IC socket by the positioning pins and positioning grooves. However, this positioning of the IC carrier has not been necessarily suitable for alignment between the IC leads of the IC package and contacts of the IC socket because there are many cases where the IC package is mounted in the IC carrier in a posture deviated in a lateral or rotating direction within a range permitting the IC leads to be moved and because the positioning of the IC carrier having the deviated posture IC package retained therein relative to the IC socket cannot correct the deviated posture of the IC package.

According to the present invention, however, as has been described in the foregoing, when an IC carrier having an IC package retained therein is placed on an IC socket, the guide member alon or in conjunction with the IC package is moved by the guiding action of the IC package guide portions so that the guide member and the IC package are aligned with each other and, with this movement, the contacts of the IC socket are elastically moved to be aligned with the IC leads of the IC package. Thus, according to the present invention, the IC package can be reliably positioned relative to the IC socket with exactitude even in the presence of errors in fabrication of the IC package and IC carrier which will cause deviation of the IC package from a suitable position in the IC carrier and, even when the IC package is positioned in a deviated posture relative to the IC socket, the IC leads of the IC package can be aligned with the contacts of the IC socket by the elastic displacement of the contacts by the guide member.

Furthermore, according to the present invention, use of the conventionally adopted positioning pins and positioning grooves can be eliminated. Even though such positioning pins and positioning grooves are used in the present invention, precision thereof is not so strictly required as compared with the conventional IC socket and IC carrier. Strict restriction on the slot formed in the IC carrier for receiving the IC leads are not imposed, either. Thus, the ease in attaching the IC carrier to and detaching it from the IC socket can be enhanced.

What is claimed is:

1. An IC socket apparatus for receiving and positioning an IC package which has a plurality of IC leads projecting laterally therefrom and carried in an IC carrier, comprising:
   an IC socket having an IC package receiving recess therein and having a plurality of contacts mounted around the periphery of said recess for engaging and contacting leads of an IC package inserted into said recess, said contacts being shiftable in the peripheral direction of said recess, said socket further having guide means thereon for contacting with a guide means on an IC carrier for guiding an IC carrier onto said IC socket with an IC package guided into said recess; and
   a guide member in said recess and having a front surface facing toward the opening of said recess and having a plurality of IC package guide portions extending upright from said front surface and spaced for engaging peripheral edge portions of an IC package to be received and positioned in said recess, and having a plurality of contact guide portions on the periphery thereof and defining a plurality of contact engaging grooves between adjacent contact guide portions at positions corresponding to positions of leads on an IC package relative to said guide portions and in which grooves said contacts are engaged, said guide member having the periphery thereof spaced inwardly from the inner peripheral surface of said recess and being movably positioned in said recess for movement laterally to and rotationally around an axis parallel to the direction in which said guide means guides an IC carrier onto said socket;
   whereby when an IC carrier carrying an IC package is placed on said IC socket to cause the IC package to move into said recess, the peripheral edge portions of the IC package engage said IC package portions, and if the IC package is shifted relative to said axis or positioned rotationally relative to said axis such that the IC package leads are not aligned with the positions of said contacts, said guide member is shifted for causing said contact guide portions to shift said contacts to positions where they will engage the leads on the IC package.

2. An apparatus as claimed in claim 1 in which said guide member has four IC package guide portions having guide grooves extending in the upright direction for receiving corners of an IC package.

3. An apparatus as claimed in claim 2 in which said guide grooves having the end at the outer end of the guide portions expanded laterally for facilitating insertion of the corners of an IC package thereinto and further having the portion between said end and said guide member conforming in shape to the corners of an IC package.

4. An apparatus as claimed in claim 1 in which said guide member has four IC package guide portions extending along said front surface having surfaces extending away from said front surface and diverging outwardly from each other for receiving four sides of an IC package.

5. An apparatus as claimed in claim 1 in which said IC socket has a guide hole in a central bottom portion of said recess, and said guide member has an engaging leg extending from a rear surface thereof and loosely inserted in said guide hole, and a pawl on the free end of said engaging leg, sai IC socket having an enlarged diameter portion of said guide hole at the bottom thereof in which said pawl is engaged for permitting said guide member to move laterally in a plane in said recess.

* * * * *